(12) United States Patent
Moller et al.

(10) Patent No.: US 7,516,678 B2
(45) Date of Patent: Apr. 14, 2009

(54) MODEL HAND FOR ELECTROMAGNETIC TESTING

(75) Inventors: Paul J. Moller, Lake Zurich, IL (US);
Eric L. Krenz, Crystal Lake, IL (US);
Roger L. Scheer, Beach Park, IL (US);
Matthew Richard Brown, Arlington Heights, IL (US); Michael S. Kramer, Gurnee, IL (US)

(73) Assignee: Motorola, Inc., Schaumburg, IL (US)

( * ) Notice: Subject to any disclaimer, the term of this patent is extended or adjusted under 35 U.S.C. 154(b) by 859 days.

(21) Appl. No.: 11/077,302

(22) Filed: Mar. 10, 2005

(65) Prior Publication Data

US 2006/0204002 A1 Sep. 14, 2006

(51) Int. Cl.
*G01N 22/00* (2006.01)
*G09B 23/00* (2006.01)
*G09B 23/08* (2006.01)

(52) U.S. Cl. .................................. 73/866.4
(58) Field of Classification Search ................. 73/866.4
See application file for complete search history.

(56) References Cited

U.S. PATENT DOCUMENTS

| 6,896,704 | B1 * | 5/2005 | Higuchi et al. ............. 623/64 |
| 2006/0128316 | A1 * | 6/2006 | Moller et al. ............. 455/67.15 |

FOREIGN PATENT DOCUMENTS

EP 1195151 A 1 4/2002
EP 1455193 A 2 9/2004

OTHER PUBLICATIONS

"Phantom Assemblies for Assessing RF Power Radiated From Wireless Devices", XP002383302, Sep. 2003, http://www.indexsar.com/pdf/Phantom-Assemblies_1104.pdf, 1 page.
Graffin J. et al., "Radiations Phantom for Handheld Phones", Vehicular Technology Conference, 2000, IEEE VTS Fall VTC 2000, 52nd, Sep. 24-28, 2000, Piscataway, NJ, IEEE vol. 2, Sep. 24, 2000, pp. 853-860, ISBN:0-7803-6507-0.
Lundmark M. et al., "A Solid Hand Phantom for Mobile Phones and Results of Measurements in Reverberation Chamber", Antennas and Propagation Society Symposium, 2004, IEEE Monterey, CA, Jun. 20-25, 2004, Piscataway, NJ, IEEE vol. 1, Jun. 20, 2004, pp. 719-722, XP010721146, ISBN: 0-7803-8302-8.
Gabriel C, "Phantom Models for Antenna Design and Exposure Assessment", Jan. 20, 1997, XP006507132, pp. 6/1-6/5.

* cited by examiner

*Primary Examiner*—Thomas P Noland
(74) *Attorney, Agent, or Firm*—Hisashi D. Watanabe

(57) ABSTRACT

A model hand (120, 700) for use in electromagnetic testing comprising a body (210, 710) and at least one digit (220, 780) extending from a side of the body. For one embodiment, the body (210) has an outer semi-cylinder surface (230) with an arcuate shape and an inner semi-cylinder surface (240) following the arcuate shape of the outer semi-cylinder surface. A digit (220) is coupled at a base end (260) coupled to the side (250) of the cylindrical body (210) to permit pivotal motion of the digit relative to the cylindrical body. For another embodiment, the body (710) has a palm-like shape with four static digits (740-770) affixed at one end to the palm-shaped body. In addition to the four static digits (740-770), a dynamic digit (780) extends from the body (710) and couples to the body to permit pivotal motion of the digit relative to the body.

6 Claims, 5 Drawing Sheets

MODEL HAND FOR ELECTROMAGNETIC TESTING

FIELD OF THE INVENTION

The present invention relates in general to microwave test equipment. More particularly, the present invention relates to models used in evaluating the effect of the human body on signals directed to and from wireless communication devices.

BACKGROUND OF THE INVENTION

The past decade has witnessed widespread adoption of personal wireless communication devices, including handheld cellular telephones, dedicated text messaging devices, and hybrid devices that combine communication and other functions. Wireless communication devices include antennas that are used to transmit and receive information-bearing RF and/or microwave signals. Antennas can be characterized by the efficiency with which they radiate and receive signals and by their gain patterns, which characterize how well the antenna can transmit and receive signals in each direction.

Handheld wireless communication devices differ from larger radio communication equipment in that they are typically operated in close proximity to a person's body, e.g., held at the side of a person's face. From an electromagnetic view point, the human body is an irregularly shaped object in which the complex permittivity (conductivity and permittivity) is spatially distributed. Although considered in isolation, an antenna of a wireless communication device can be analyzed and understood using a variety of mathematical methods, placing the antenna near a person's body complicates matters and can dramatically change the performance of the antenna from what is predicated based on mathematical models of the antenna in isolation. Interaction with a person's body may lead to loss of signal energy, and alteration of the gain pattern.

In order to better understand the effect of a user's body on antenna performance, models of the human head that are suitable for electromagnetic testing have been made. These models typically take the form of a hollow molded model of a head that is filled with an electrolyte solution that is intended to simulate the bulk electromagnetic properties of a person's head. Models of a human hand have also been constructed from carbon-and-aluminum loaded silicone rubber, as well as semi-flexible shell filled with an electrolyte solution that is intended to simulate the bulk electromagnetic properties of a person's hand.

Existing model hands are overly complicated, thus introducing undesirable by products. For example, when using the fully articulated hand phantom, the precise placement of the lesser three digits (middle, ring and pinky) on the surface of the wireless communication device under test is difficult to determine, and can be difficult to achieve in practice for the fully articulated hand phantom. Also, the precise contact location of the thumb on the wireless communication device varies. Typically, the end of the thumb is near the top of the device, and the thumb end at the top plane of the phone is preferred. The position and contact location of the "pointer" digit is the most contentious. It is desirable for the pointer digit to be extended and contact the wireless communication device somewhere above the center line of the device and roughly in the middle of the device left to right.

Thus, parameters for model hands of hand phantoms that are truly required need to be distinguished from parameters that are merely desirable but not required. Based on this information, it is desirable to have a simplified universal model of a hand phantom having minimum requirements for the hand model by including the parameters that are truly required.

DETAILED DESCRIPTION OF THE PREFERRED EMBODIMENTS

Figure 1:
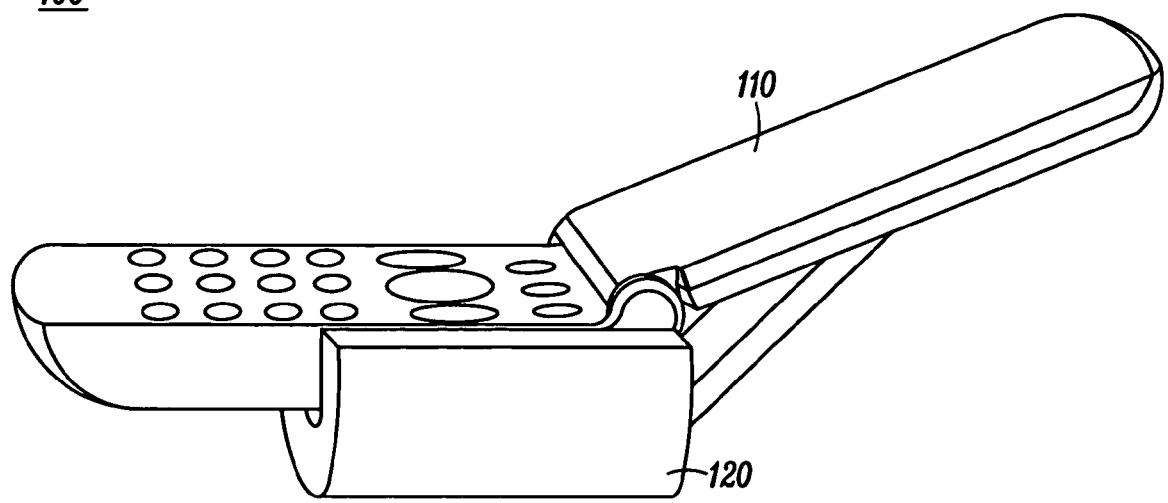
FIG. 1 is a side view of a model hand supporting a wireless communication device in accordance with the present invention.

The present invention is a universal model hand of a hand phantom having minimal design complexity and maximum ease-of-use without sacrificing accuracy of replicating the radio frequency ("RF") loading effects of a human hand. In particular, the universal hand model of the hand phantom may serve a wide range of requirements that are frequently encountered during wireless device testing. The hand model minimizes any uncertainties of finger placement and phone placement relative to the palm of a human hand, and any impact to a wireless device resulting from these parameters.

The present invention is a simplified universal model hand of a hand phantom that maintains minimum requirements for the hand model by including parameters that are truly required, not just merely desired. In particular, the lesser three digits of a hand phantom (the middle digit, the ring digit and the pinky digit) are typically positioned near one another, and generally located on the lower region of the wireless communication device. The ability to separately articulate the lesser three digits are considered as not required for the embodiments in accordance with the present invention. Also, for positioning an articulated hand phantom on a wireless communication device, at least some form of articulation of the pointer digit is considered as required. However, in order to drive towards the goal of simplification, articulation of the $2^{nd}$ and $3^{rd}$ joints of the pointer digit is considered at as not required. Further, the end of the thumb is positioned at a top plane of the wireless communication device. The location of the base of the thumb is determined by the length of the thumb relative to the end of the thumb more than anything else. For wireless communication devices, the end of the thumb being at the top plane of the device also means that the length of the thumb is parallel to the body of the phone. Thus, for the purposes of the embodiments of the present invention, the length of the thumb will be reduced substantially, such as to zero, thus the articulation of the thumb will be not required. It is important to note that ease of use in terms of positioning accuracy is critical to the successful design of a universal model hand. The ability to duplicate the position of the wireless communication device and the model hand for consistent over-the-air measurement results is required.

One aspect of the present invention is a model hand for use in electromagnetic testing comprising a cylindrical body and a digit extending from a side of the cylindrical body. The cylindrical body has an outer semi-cylinder surface with an arcuate shape and an inner semi-cylinder surface following the arcuate shape of the outer semi-cylinder surface. The digit has a rigid linear form and a base end coupled to the side of the cylindrical body to permit pivotal motion of the digit relative to the cylindrical body.

Another aspect of the present invention is a model hand for use in electromagnetic testing comprising a palm-shaped body having top and lateral sides and five digits supported by the palm-shaped body. First, second and third static digits are affixed at one end to the top side of the palm-shaped body. A fourth static digit is affixed at one end to the lateral side of the palm-shaped body. A dynamic digit extends from the top side of the palm-shaped body. The dynamic digit includes a base end coupled to the top side of the palm-shaped body to permit pivotal motion of the digit relative to the palm-shaped body.

Regarding FIG. 1, there are shown components for testing, such as electromagnetic testing, of wireless communication devices, accordance with the present invention. The components comprise a wireless communication device 110 supported by a first embodiment 120 of a universal model hand of a hand phantom. The wireless communication device 110 is capable of communicating with one or more the wireless communication networks 110 utilizing cellular-based communications such as analog communications (using AMPS), digital communications (using CDMA, TDMA, GSM, iDEN, GPRS, or EDGE), and next generation communications (using UMTS or WCDMA) and their variants; a peer-to-peer or ad hoc communications such as HomeRF, Bluetooth and IEEE 802.11 (a, b or g); and other forms of wireless communication.

The first preferred embodiment 120 has bulk "hand tissue" that extends to the top plane of the wireless communication device 110, and runs along a side of the device just as in a real human hand. A thumb-like member has been omitted and replaced by a simplified portion of the bulk hand/palm.

Figure 2:
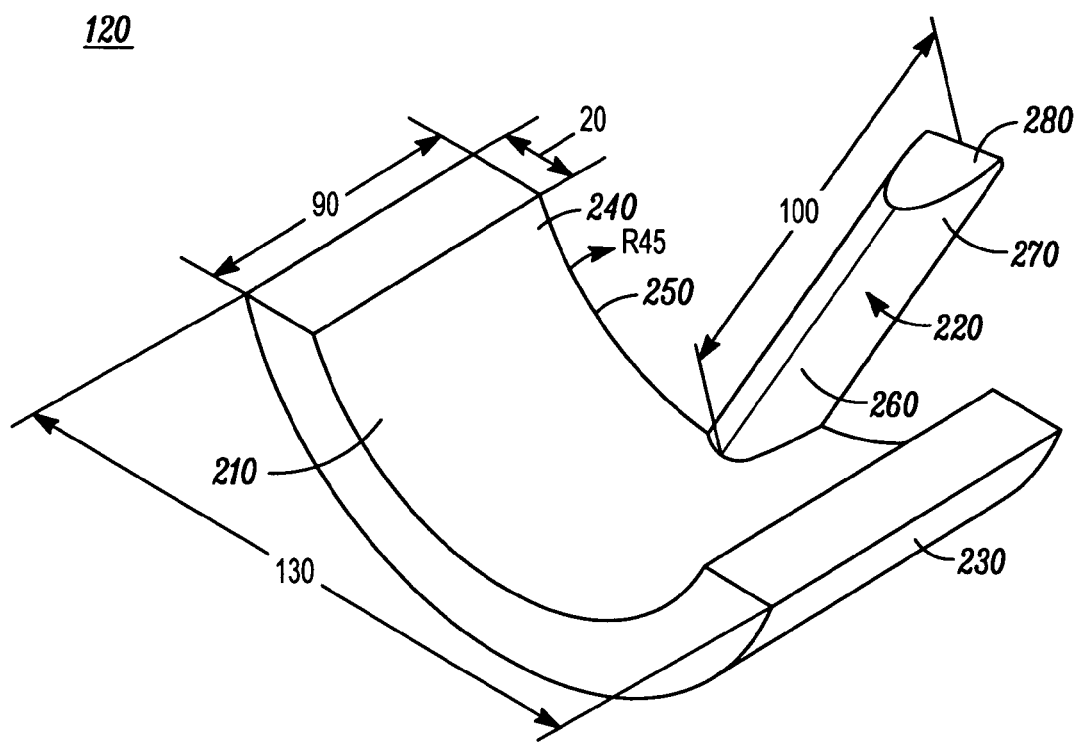
FIG. 2 is a perspective view of the model hand of FIG. 1 without the wireless communication device in which a digit of the model hand is extending straight back.

Referring to FIG. 2, the first embodiment 120 of the universal model hand comprises a cylindrical body 210 and an extending digit 220 extending from one side of the cylindrical body. The cylindrical body 210 has an outer surface 230 and an inner surface 240. The outer surface 230 has a semi-cylinder or half-cylinder form, and the inner surface 240 has a similar, yet smaller, semi-cylinder or half-cylinder form. The outer surface 230 had an arcuate shape, and the inner surface 240 follow the arcuate shape of the outer surface so that each location of the inner surface is generally equidistant from a closest location of the outer surface. The extending digit 220 has a rigid linear form and extending from a top side 250 of the cylindrical body 210. The extending digit 220 includes a base end 260 coupled to the top side 250 of the cylindrical body 210 and a distal end 270 opposite the base end. The base end 260 is coupled to the top side 250 of the cylindrical body 210 to permit pivotal motion of the digit relative to the cylindrical body. The extending digit 220 is cylindrical in shape, and the distal end 270 of the extending digit may have a tapered shape 280.

Figure 3:
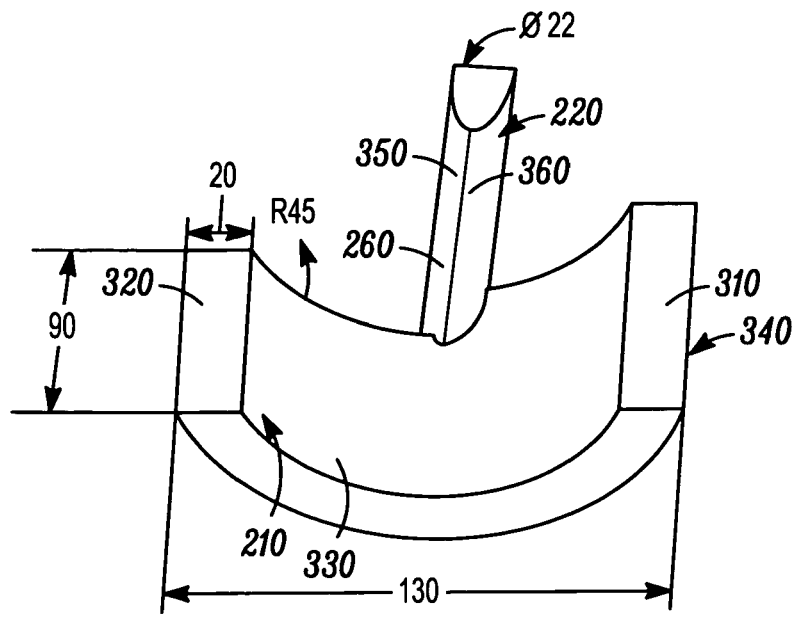
FIG. 3 is a front view of the model hand of FIG. 2 in which the digit is angled to one side.
Figure 4:
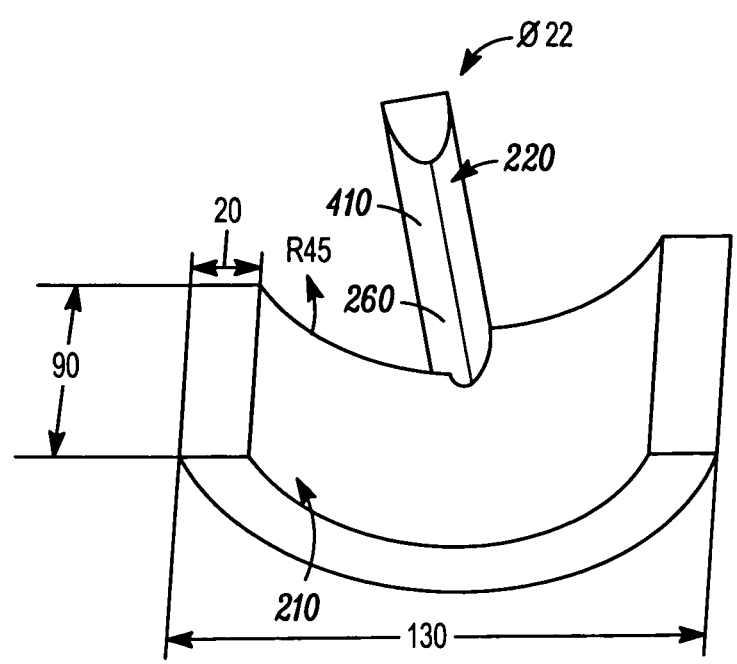
FIG. 4 is another front view of the model hand of FIG. 2 in which the digit is angled to another side.

Referring to FIGS. 3 and 4, the cylindrical body of the first preferred embodiment 120 includes first and second lateral sides 310, 320. The first preferred embodiment 120 may be formed to simulate a thumb and lesser three digits (i.e., middle, ring and pinky) of a typical human hand. For example, the first lateral side 310 representing the thumb, from base to tip, is longer than the second lateral side 320 representing the lesser three digits. The first preferred embodiment 120 may be formed to simulate dimensions of a typical human hand. For this embodiment, the cylindrical body 210 may have a width 330 extending between the first and second lateral sides 310, 320 that is greater than the length 340 of the first and second lateral sides, individually. For example, the width 330 of the cylindrical body 210 may be about 130 mm and the length 340 of the cylindrical body may be about 90 mm. The digit 220 of the first preferred embodiment 120 may be formed to simulate dimensions of a pointer finger of a typical human hand. For this embodiment, the digit 220 may have a length 350 from the base end to the distal end that is less than the width 330 of the cylindrical body 210 but greater than the length 340 of the cylindrical body. For example, the length 350 of the digit 220 may be about 100 mm.

As shown in FIGS. 3 and 4, the position of the digit 220 may pivot laterally relative to the cylindrical body 210. For example, as shown in FIG. 3, the digit 220 may pivot to a right-hand position 360 relative to the base end 260 of the digit where it couples to the cylindrical body 210 whereas, as shown in FIG. 4, the digit may pivot to a left-hand position 410 relative to the base end of the digit.

Figure 5:
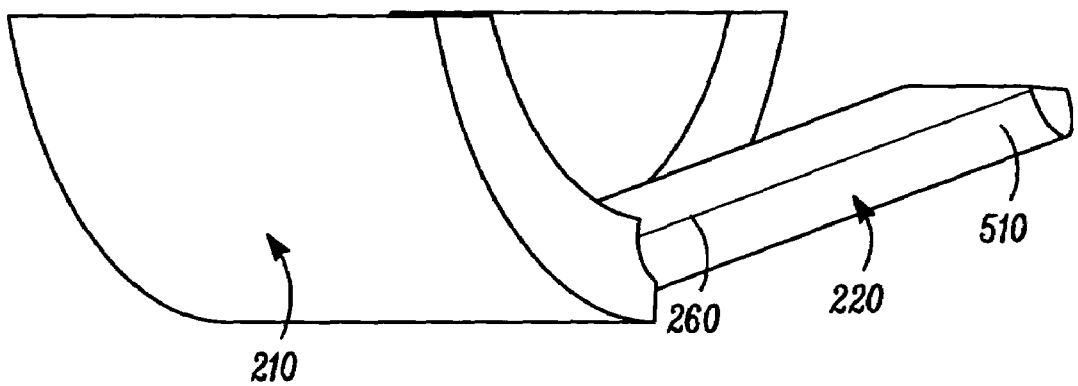
FIG. 5 is a frontal side view of the model hand of FIG. 2 in which the digit is positioned at a particular elevation.
Figure 6:
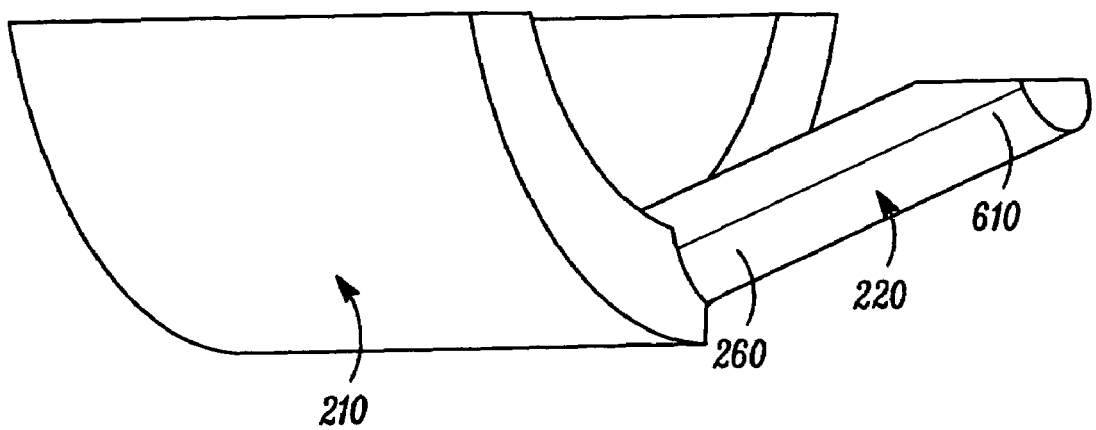
FIG. 6 is a frontal side view of the model hand of FIG. 2 in which the digit is positioned at a position higher than the particular elevation shown in FIG. 5.

Referring to FIGS. 5 and 6, the position of the digit 220 may pivot vertically relative to the cylindrical body 210. For example, as shown in FIG. 5, the digit 220 may pivot to a lower position 510 relative to the base end 260 of the digit where it couples to the cylindrical body 210 whereas, as shown in FIG. 6, the digit may pivot to an upper position 610 relative to the base end of the digit.

It should be noted that there are several special features of the first preferred embodiment 120, which have application to other embodiments of the present invention. The lesser three digits, namely the middle, ring and pinky digits, may be fused to form a solid that "loads" the radiating structure of the wireless communication device similar to that of the human digits. Also, the pointer digit may be simplified to a circular, oblong or other cross section with one or more permanent bends. In addition, the volume of the hand model may closely approximate the volume of a typical human hand, such as about 400 cm$^3$. Further, the hand model may be homogeneous or in-homogeneous, i.e., made from 2 or more tissue simulants, in Er and conductivity for purposes of electromagnetic testing.

Figure 7:
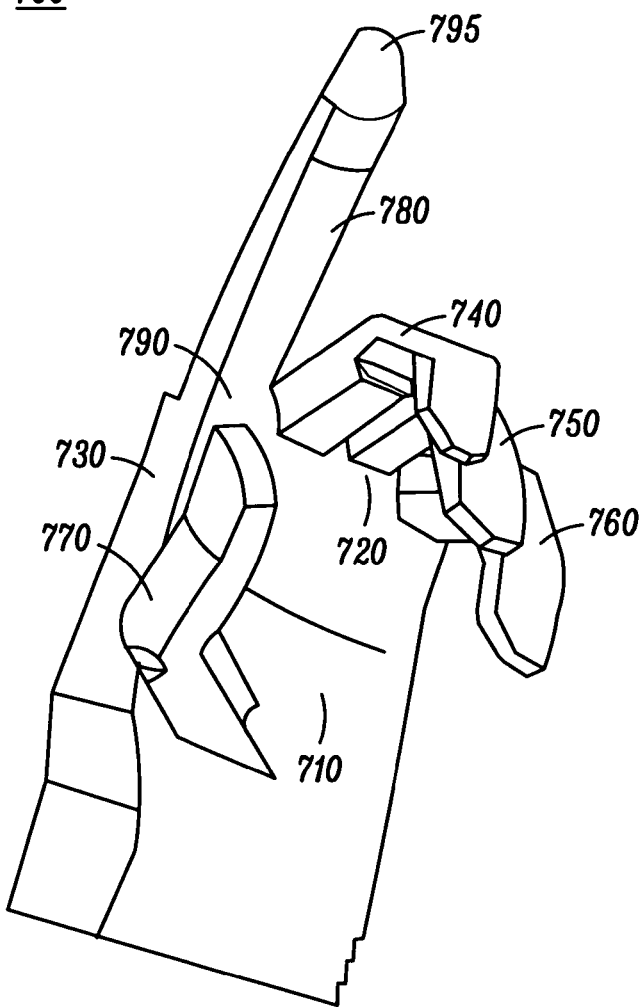
FIG. 7 is a perspective view of another model hand in accordance with the present invention, in which a digit of the model hand is extending upward.

Referring to FIG. 7, a second embodiment 700 of the universal model hand comprises a palm-shaped body 710 having a top side 720 and a lateral side 730. Three static digits, i.e., lesser three digits, namely a middle digit 740, a ring digit 750, and a pinky digit 760, are affixed at one end to the top side 720 of the palm-shaped body 710. A static digit, namely a thumb digit 770, is affixed at one end to the lateral side 730 of the palm-shaped body 710. A dynamic digit, namely a pointer digit 780, has a generally cylindrical shape and extends from the top side 720 of the palm-shaped body 710. The dynamic digit includes a base end 790 coupled to the top side 720 of the palm-shaped body 710 to permit pivotal motion of the dynamic digit relative to the palm-shaped body. Similar to the first embodiment 120, one or more digits of the second embodiment 700 may have a particular shape adapted or adaptable for support against a surface of the wireless communication device. For example, one or more digits of the first or second embodiments 120, 700 may be tapered 280, 795 at one end.

Figure 8:
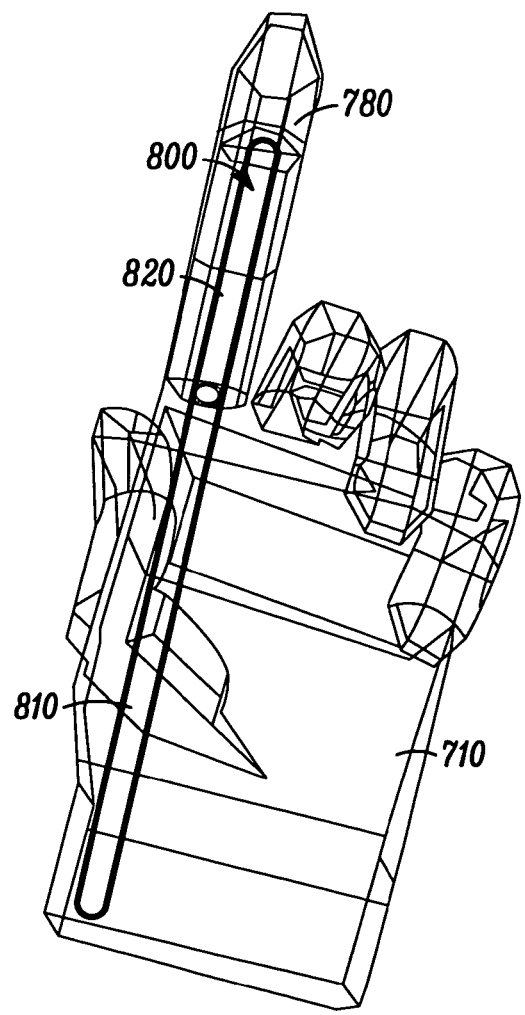
FIG. 8 is a skeletal view of the model hand of FIG. 7 showing inner components of the digit extending through the model hand and the digit.

Referring to FIG. 8, there are shown internal components 800 supporting the dynamic digit of the second embodiment 700. The internal components include a first portion 810 that extends through the palm-shaped body 710 and a second portion 820 that extends into the dynamic digit, such pointer digit 780. It should be noted that the first portion 810 may extend through all or part of the palm-shaped body 710 and the second portion 820 may extend through all or part of the dynamic digit.

Figure 9:
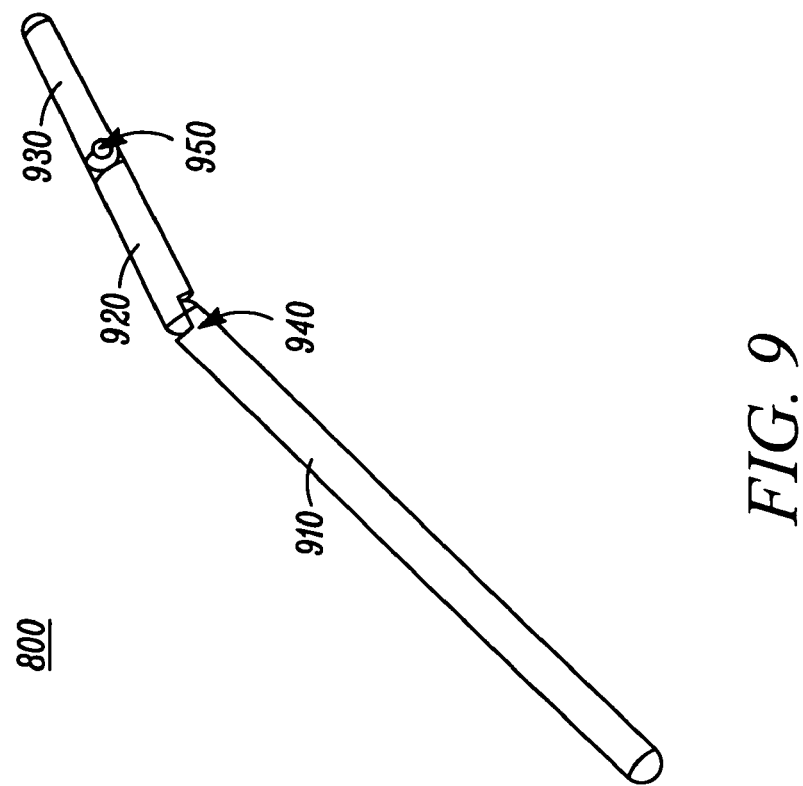
FIG. 9 is a perspective view of the inner components of the digit of FIG. 8.

Referring to FIG. 9, the internal components 800 that support the dynamic digit are shown. The internal components 800 include two or more sections meeting at a hinge or joint between at least two sections. For example, the internal components 800 may include a first section 910, a second section 920 and a third section 930, in which a first joint 940 may be located between the first and second sections, and a second joint 950 may be located between the second and third sections. Each hinge or joint of the internal components 800 may provide pivotal movement in one or more directions for its corresponding sections. For the second embodiment 700, each hinge or joint provides pivotal movement along a single axis, i.e., in one circular direction. Also, for the second embodiment 800, the first joint 940 provides pivotal movement of the first and second sections 910, 920 in a first direction and the second joint 950 provides pivotal movement of the second and third sections 920, 930 in a second direction substantially orthogonal to the first direction. Thus, the second embodiment 800 provides pivotal movement of the internal components 800, and thus the dynamic digit, in two rotational directions.

Figure 10:
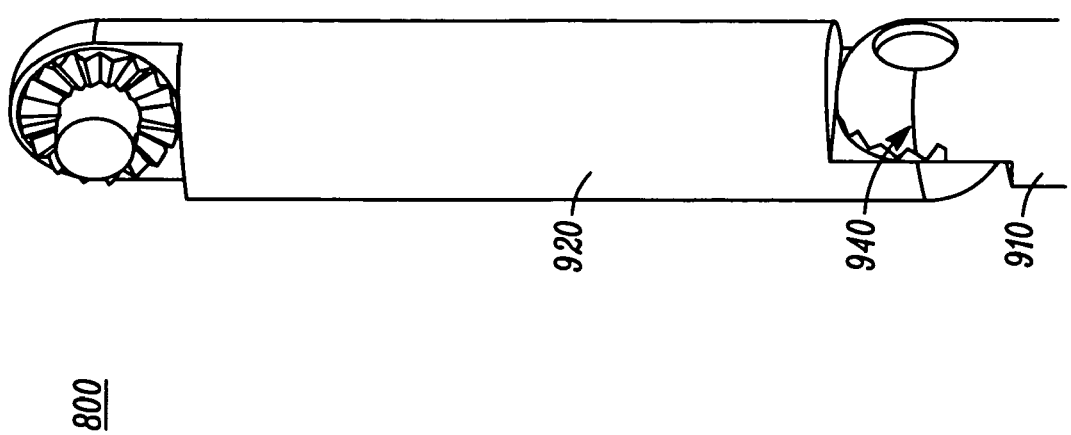
FIG. 10 is a perspective view of one end of the inner components of the digit of FIG. 9.

Referring to FIG. 10, each hinge or joint may be constructed to manage the positioning of its corresponding sections relative to each other. In particular, each hinge or joint may have non-smooth patterns formed on the inner joining surfaces or contact ridges so that pivotal movement between sections may be resisted. For example, contact ridges may be formed at the inner surfaces of the first joint 940 to resist the pivotal movement of the first section 910 relative to the second section 920.

The model hand may be configured to simulate other aspects of a typical human hand. For example, for the hand grip, the middle, ring, and small digits may be positioned in the same plane in a nearly linear fashion. Also, the distance between the thumb and the plane that the middle, ring, and small finger reside may be 60% of the width of the wireless communication device or wider, but no wider than 90% the width of the device.

Also, the second embodiment 700 may benefit from certain configurations as well. For example, the internal components 800 may consist of three distinct sections. The first section 910 may reside in the palm, starting at the base and ending at the base knuckle of the pointer finger. The second section 920 may reside in the first segment of the pointer finger of the aforementioned hand. The knuckle joint may be comprised of plate gears, one face on the palm segment and the other on the first segment of the pointer finger. The gears may allow for movement in twenty degree increments or total movement, and be oriented so that the finger may rotate from side-to-side. The final segment 930 may reside in the second (middle) segment of the pointer finger and may terminate just before the final segment in the pointer finger. A similar plate gear may reside between the second and third segments of the internal components 800. This gear may also allow for twenty degree increments of movement. This gear may be oriented to allow for forward and backward movement of the final two segments of the pointer finger.

The composition of the materials used to produce the embodiments of the present invention should be rigid enough to support a wireless communication device and have properties that minimize any interference with electromagnetic testing. For example, for the second embodiment described above, a silicone, carbon and aluminum composition specifically formulated to have RF dielectric properties of the aggregate hand tissues may be used for the external portion of the model hand, and a Delrin™ type plastic, with a diameter no more than 7.5 mm, may be used for the internal components 800 of the pointer finger.

For a third embodiment, the index or pointer digit may be removable. For example, referring to FIG. 2, the base end 260 of the extending digit 220 of the first embodiment may be removably coupled to the top side 250 of the cylindrical body 210. Likewise, referring to FIG. 7, the base end 790 of the dynamic digit (such as pointer digit 780) of the second embodiment may be removably coupled to the top side 720 of the palm-shaped body 710. Thus, the pointer digit of the third embodiment may be replaced with a digit having a different orientation to allow for different positioning. Also, a single hand may be constructed for receiving three different digits instead of having to construct three different hands.

While the preferred embodiments of the invention have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A model hand for use in electromagnetic testing comprising:
   a cylindrical body having an outer semi-cylinder surface with an arcuate shape and an inner semi-cylinder surface following the arcuate shape of the outer semi-cylinder surface; and
   a digit, having a rigid linear form, extending from a side of the cylindrical body, the digit including a base end coupled to the side of the cylindrical body to permit pivotal motion of the digit relative to the cylindrical body.

2. The model hand of claim 1, wherein the digit is cylindrical in shape.

3. The model hand of claim 1, wherein the digit includes a distal end, located opposite the base end, having a tapered shape.

4. The model hand of claim 1, wherein the cylindrical body includes first and second lateral sides, the first lateral side being longer than the second lateral side.

5. The model hand of claim 1, wherein the cylindrical body includes first and second lateral sides, the cylindrical body having a width extending between the first and second lateral sides that is greater than the length of the first and second lateral sides, individually.

6. The model hand of claim 5, wherein the digit includes a distal end, located opposite the base end, the digit having a length from the base end to the distal end that is less than the width but greater than the length of the cylindrical body.

* * * * *